United States Patent
Froment et al.

(10) Patent No.: US 7,018,865 B2
(45) Date of Patent: Mar. 28, 2006

(54) METHOD OF PROTECTING AN ELEMENT OF AN INTEGRATED CIRCUIT AGAINST THE FORMATION OF A METAL SILICIDE

(75) Inventors: Benoît Froment, Grenoble (FR); François Wacquant, Saint Ismier (FR)

(73) Assignee: STMicroelectronics S.A., (FR)

( * ) Notice: Subject to any disclaimer, the term of this patent is extended or adjusted under 35 U.S.C. 154(b) by 0 days.

(21) Appl. No.: 10/873,750

(22) Filed: Jun. 21, 2004

(65) Prior Publication Data

US 2005/0186701 A1    Aug. 25, 2005

(30) Foreign Application Priority Data

Jun. 25, 2003  (FR) .................................. 03 07690

(51) Int. Cl.
*H01L 21/44* (2006.01)
*H01L 21/48* (2006.01)
*H01L 21/50* (2006.01)

(52) U.S. Cl. ...................... 438/106; 438/595
(58) Field of Classification Search ................ 438/106, 438/310, 313, 590, 595, 604, 606
See application file for complete search history.

(56) References Cited

U.S. PATENT DOCUMENTS

| | | | |
|---|---|---|---|
| 5,336,903 A | 8/1994 | Ozturk | |
| 6,214,679 B1 | 4/2001 | Murthy | |
| 6,388,296 B1 | 5/2002 | Hsu | |
| 6,399,487 B1 | 6/2002 | Lai | |
| 6,465,317 B1 * | 10/2002 | Marty | 438/321 |
| 6,596,594 B1 * | 7/2003 | Guo | 438/279 |

OTHER PUBLICATIONS

French Preliminary Search Report, FR 03 07690, dated Mar. 3, 2004.

* cited by examiner

*Primary Examiner*—Phuc T. Dang
(74) *Attorney, Agent, or Firm*—Jenkens & Gilchrist, PC

(57) ABSTRACT

A semiconductor material is protected against the formation of a metal silicide by forming a layer of a silicon/germanium alloy on the material. The material which is protected belongs to a component of an integrated circuit comprising other components that have to be subjected to a siliciding operation. The method of protection includes depositing a layer of silicon/germanium alloy on the integrated circuit. The layer of silicon/germanium alloy is then removed from the areas to be silicided. A metal is then deposited on the structure and a metal silicide is formed therefrom. The unreacted metal and the metal/silicon/germanium ternary alloy that may have formed are removed, and the layer of silicon/germanium alloy is removed so as to expose the unsilicided component.

21 Claims, 6 Drawing Sheets

METHOD OF PROTECTING AN ELEMENT OF AN INTEGRATED CIRCUIT AGAINST THE FORMATION OF A METAL SILICIDE

PRIORITY CLAIM

The present application claims priority from French Application for Patent No. 03 07690 filed Jun. 25, 2003, the disclosure of which is hereby incorporated by reference.

BACKGROUND OF THE INVENTION

1. Technical Field of the Invention

The present invention relates to integrated circuits and more particularly to the protection of a component of such a circuit against the formation of a metal silicide.

2. Description of Related Art

At the present time, there is need in the microelectronics field to obtain components having different resistance values. When the components of an integrated circuit undergo a siliciding operation, that is to say the formation of a metal silicide on areas made of silicon, the silicon/metal alloy obtained results in a very low resistance of these areas. On the other hand, when this component has not been silicided, this resistance is high. An example of the component that usually has to have a high resistance is an input/output transistor of a circuit. To obtain components having high resistance values, it is therefore envisaged to protect these components from the siliciding.

At the present time, a method allowing certain elements of an integrated circuit to be protected against the formation of a metal sicilide is known.

More precisely, the method conventionally used involves the deposition of a bilayer comprising a tetraethyl orthosilicate (more widely known as TEOS) layer surmounted by a silicon nitride layer. Those areas of the integrated circuit on which it is desired to form a metal silicide are exposed by removing the bilayer locally. This removal comprises, after the silicon nitride has been etched away, a chemical treatment so as to strip off the TEOS from the areas to be silicided. This chemical treatment uses hydrofluoric acid.

However, this method has drawbacks. A first drawback stems from the high thermal budget used in depositing the bilayer, and this proves difficult to make compatible with a CMOS technology.

Another drawback stems from the fact that the chemical treatment using hydrofluoric acid partly etches the STI (Shallow Trench Isolation) material that separates the various components of the integrated circuit, and this may cause junction losses during siliciding of transistors that are not protected by the bilayer.

There is accordingly a need to provide a solution which does not suffer from the foregoing drawbacks.

SUMMARY OF THE INVENTION

An embodiment of the invention relates to a method of protecting a semiconductor material against the formation of a metal silicide. A silicon/germanium alloy is formed on the material. The germanium content of the alloy is, for example, between 5 and 50%, preferably around 30%. In other words, the conventionally used bilayer is replaced with a silicon/germanium layer.

The thickness of the layer of silicon/germanium alloy is preferably greater than 50 Å, for example around 200 Å.

An embodiment of the invention advantageously applies to a material belonging to a component of an integrated circuit having other components that have to be subjected to a siliciding operation. In accordance with a method according to this embodiment, the method comprises:

a) depositing a layer of silicon/germanium alloy on the entire integrated circuit;

b) removing the layer of silicon/germanium alloy from the areas to be silicided;

c) depositing a metal on the structure obtained in step b);

d) forming a metal silicide from the deposited metal;

e) removing the unreacted metal (it is possible that a metal/silicon/germanium alloy forms as a very thin layer on the silicon/germanium alloy; this new alloy may be removed at this step of the method); and f) removing the layer of silicon/germanium alloy so as to expose the unsilicided component.

According to a variant of the invention, the material to be protected belongs to a polysilicon line.

According to a variant of the invention, the material to be protected belongs to at least one of the source, drain and gate regions of a transistor.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
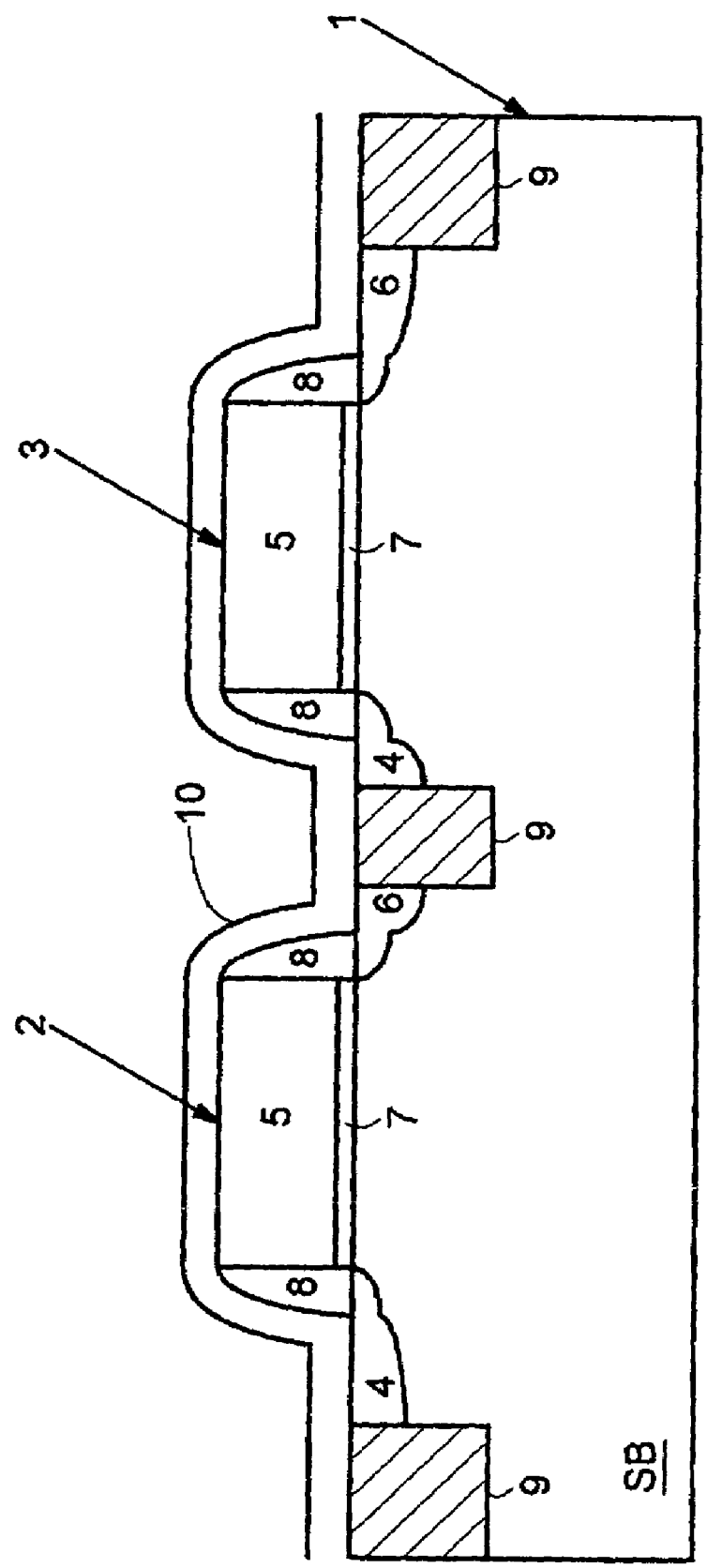
FIGS. 1–6 illustrate, highly schematically, one way of implementing the method according to the invention.

FIG. 1 shows a silicon wafer 1 of an integrated circuit comprising, for the sake of simplification, two transistors 2 and 3. Conventionally, the transistors 2 and 3 comprise a source region 4, a gate region 5, a drain region 6, a gate oxide region 7 and insulating spacers 8.

The transistors are separated by STI-type isolating trenches 9.

A layer of an amorphous silicon/germanium alloy 10 was deposited on the entire integrated circuit. This type of deposition is conventional and known to those skilled in the art. It is carried out by chemical vapor deposition (CVD) using a silicon source such as silane, a germanium source such as germane and a carrier gas at a temperature of 700° C. for example and at a pressure of a few hundred torr, which pressure may be much lower depending on the equipment. The silicon/germanium layer 10 has a minimum thickness of 50 Å for example and is preferably around 200 Å.

It will now be assumed that only the transistor 3 has to undergo a siliciding treatment.

A selective removal of the silicon/germanium layer 10 is then carried out locally. Such a removal operation is known per se and consists in protecting, with a mask, those areas of the layer 10 that must not be removed and then in removing the unprotected areas, for example using a fluorine plasma.

The use of a fluorine plasma is much gentler on the materials of the integrated circuit, than the use of hydrofluoric acid.

Figure 2:
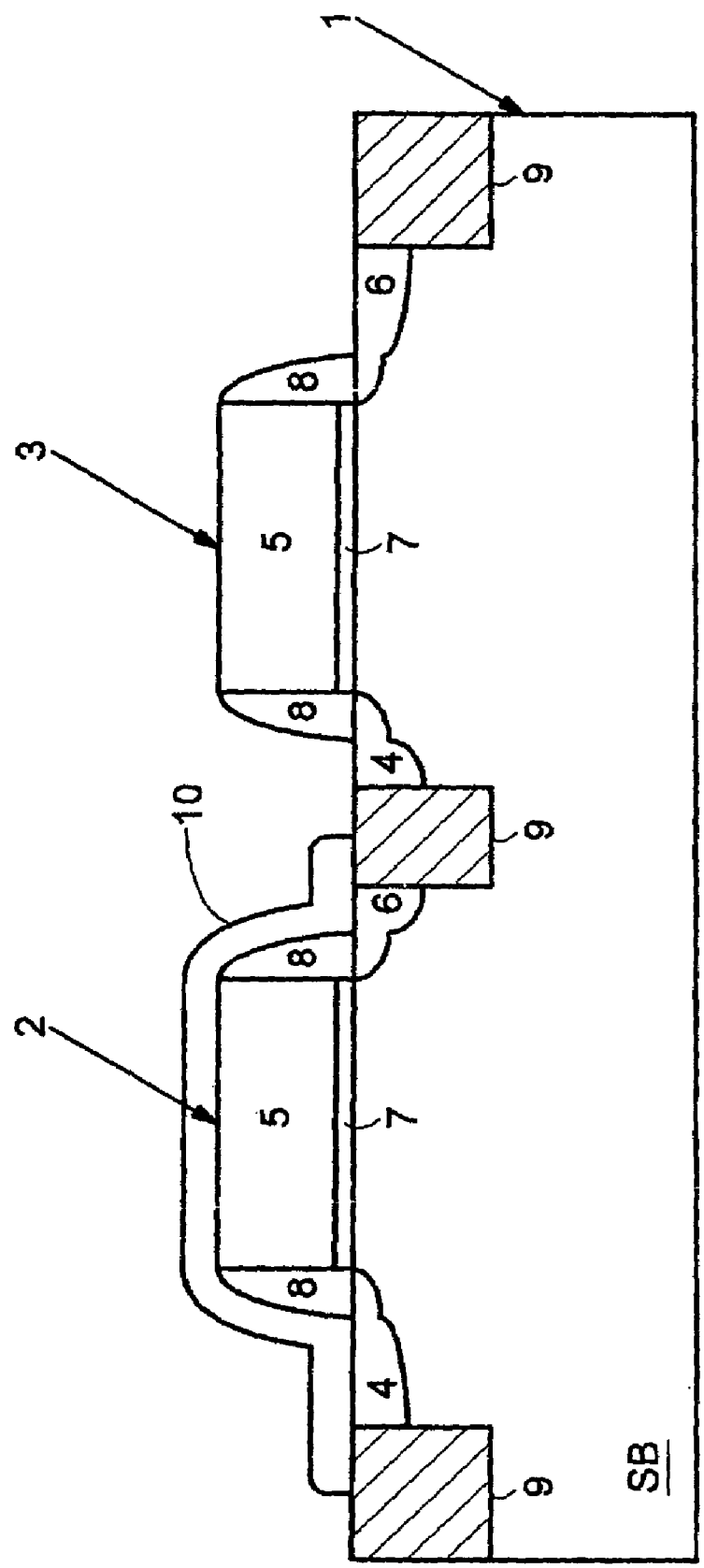
Figure 3:
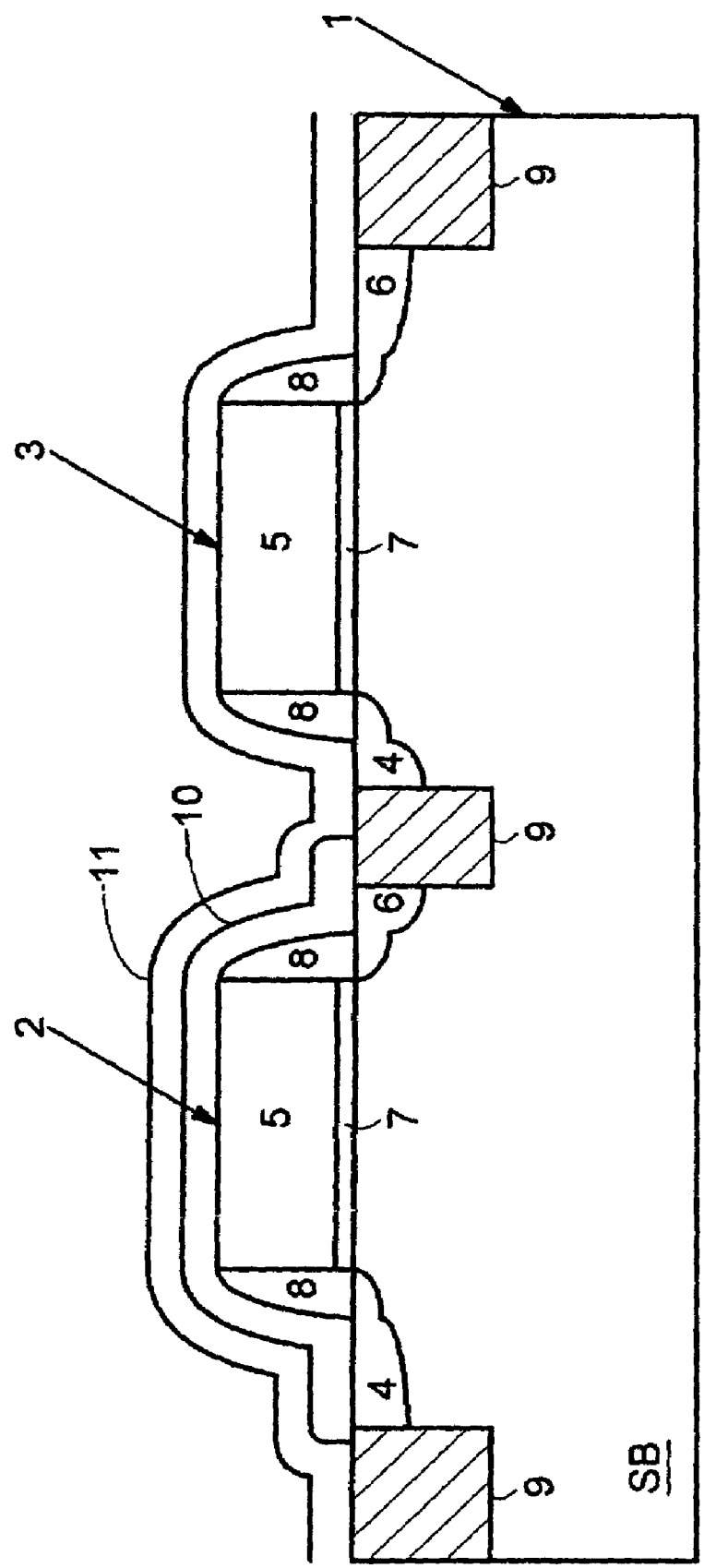

The structure illustrated in FIG. 2 is then obtained. Next (FIG. 3), a layer 11 of metal to be silicided, such as cobalt or nickel, is deposited. Cobalt will be used to exemplify the invention.

Next, a siliciding step is carried out in a conventional manner known per se.

Figure 4:
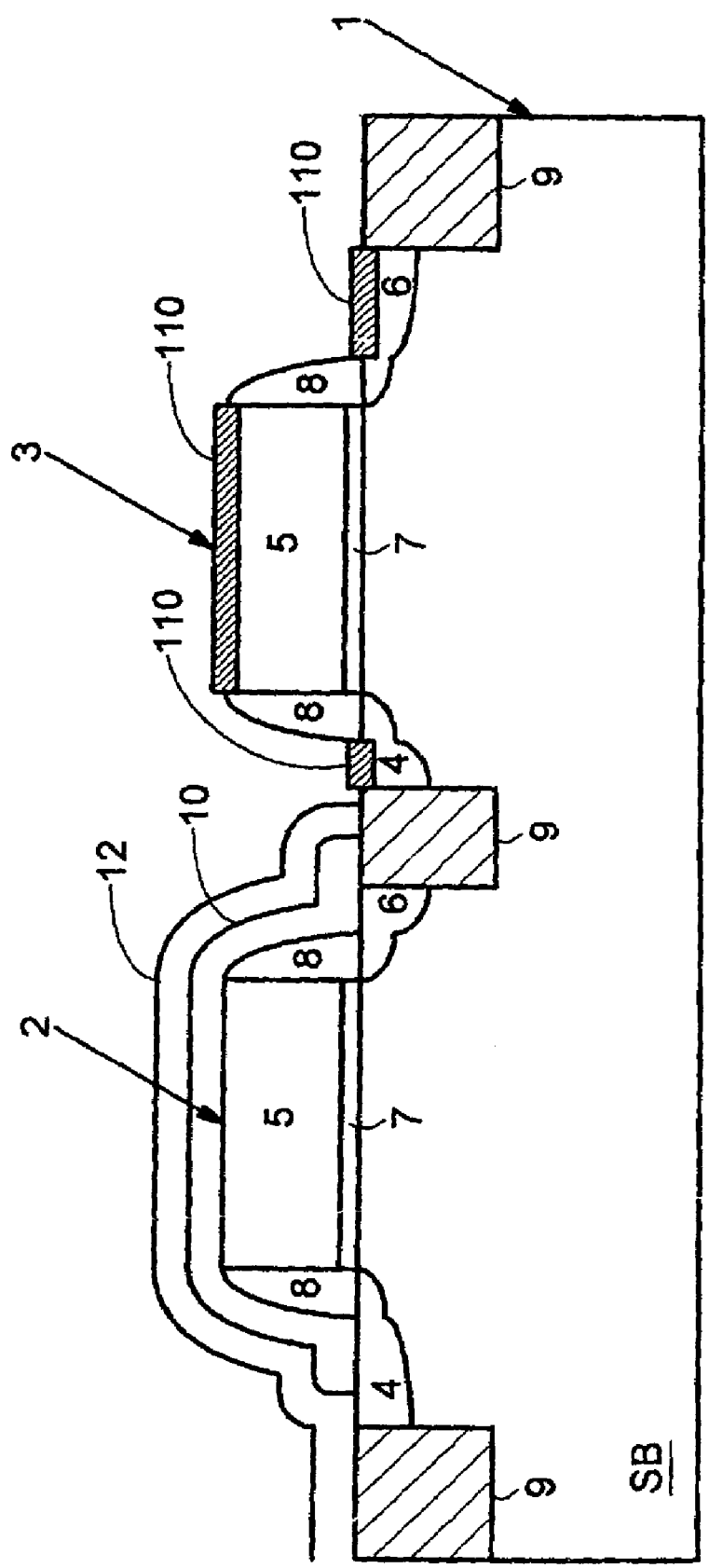

After this siliciding step, the structure illustrated in FIG. 4 is obtained. In this figure, the areas 110 are silicon/cobalt alloys obtained as a result of the siliciding. Moreover, during the siliciding operation, some of the cobalt will form with the layer of silicon/germanium alloy 10 a layer of an SiCoGe ternary alloy. The reference 12 denotes the cobalt that has not reacted during the siliciding and also the subjacent ternary alloy.

The circuit will then undergo a chemical treatment so as to remove, from its surface, the cobalt that has not reacted during the siliciding and the SiCoGe ternary alloy. The chemical methods explained below are known and conventionally used for removing cobalt. These methods leave the layer of silicon/germanium alloy unaffected.

One conventional chemical treatment makes use of a solution called SC1 (Standard Clean 1) solution consisting of a mixture of aqueous ammonia, hydrogen peroxide and water, possibly in a 1/1/10 ratio, and a solution called "SC2" (Standard Clean 2) solution consisting of a mixture of hydrochloric acid, hydrogen peroxide and water possibly in a 1/1/10 mixture.

Conventionally, the SC1 solution is used at 65° C. and the SC2 solution is used at room temperature. These solutions are used one after the other and in any order.

Another method for removing the cobalt may be envisaged. This consists, as previously, of a chemical treatment using two solutions.

The first is the SC1 solution defined above, the second solution, called SPM (Sulfuric Peroxide Mixture) consisting of a mixture of sulfuric acid, hydrogen peroxide and water in proportions of 8/5/1. The SPM solution is conventionally used at a temperature between 80 and 160° C.

Both these chemical treatments can be used not only to remove the cobalt, or nickel in the case of siliciding with nickel, but also their respective ternary compound SiCoGe or SiNiGe. These ternary alloys are etched very easily by this type of chemical treatment. The ease of removal of the ternary alloy is an advantage that this process has over the methods of the prior art.

Figure 5:
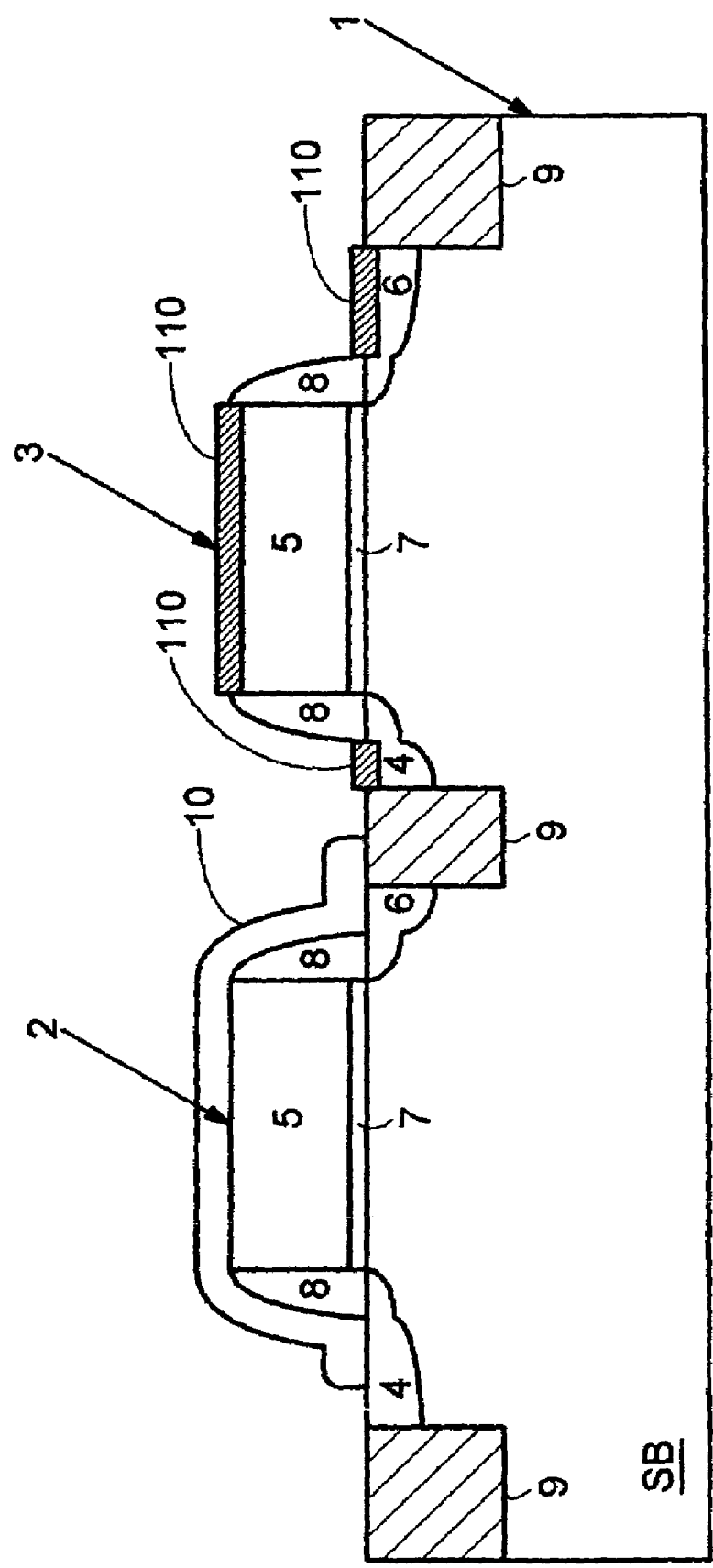

FIG. 5 shows the integrated circuit once this chemical treatment has been carried out.

Figure 6:
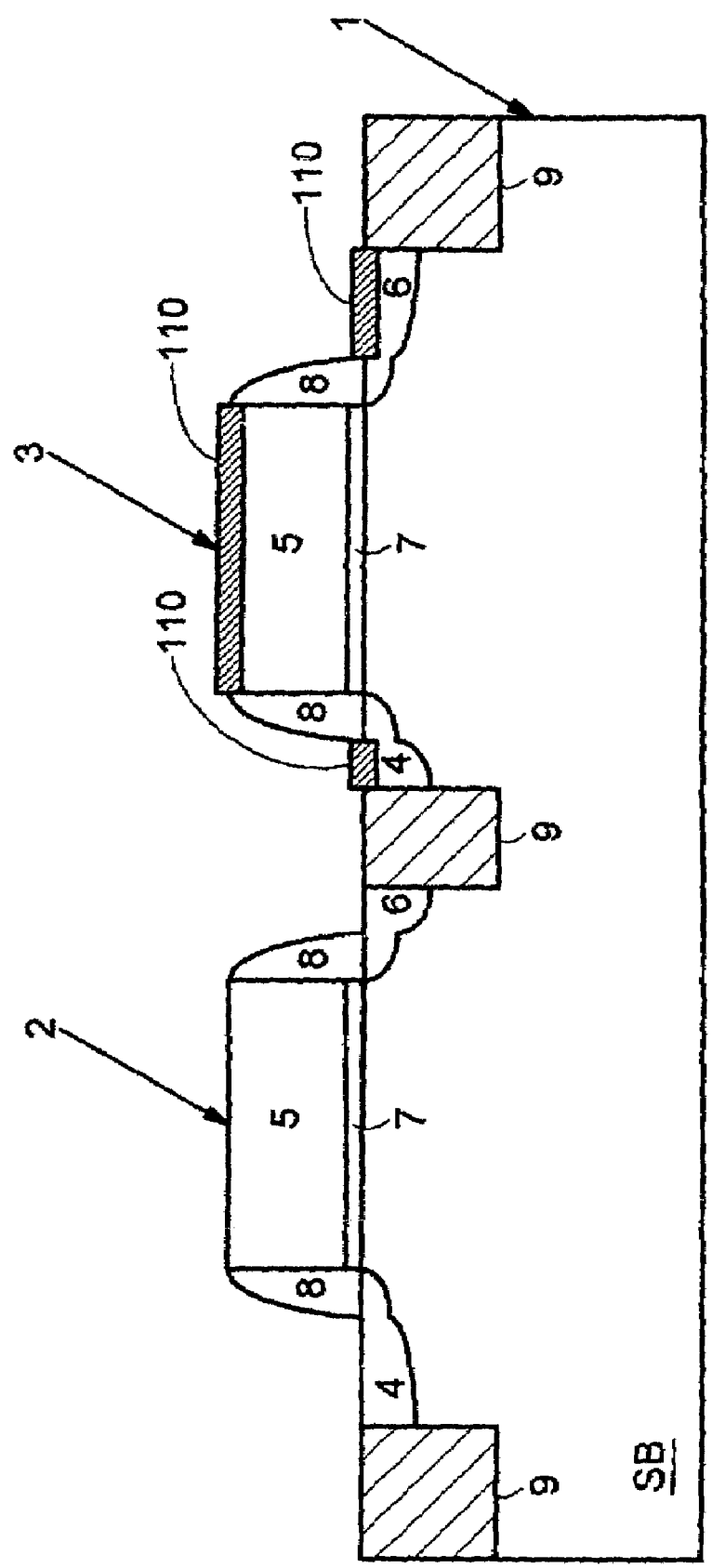

FIG. 6 shows the integrated circuit once the silicon/germanium layer 10 has been removed. This silicon/germanium alloy layer is removed, for example, in the same way as that used with reference to FIG. 2. Unlike in the method of the prior art, the protective layer may be removed at process end by a sparingly corrosive method.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method of protecting a semiconductor material against the formation of a metal silicide, comprising:
   forming a layer of a silicon/germanium alloy on the semiconductor material; and
   selectively removing the silicon/germanium alloy from a certain portion of the silicon material to allow for silicidation of that certain portion while retaining the silicon/germanium alloy on another portion of the semiconductor material to protect against silicidation of that another portion.

2. The method according to claim 1, wherein the thickness of the layer of silicon/germanium alloy is greater than about 50 Å.

3. The method according to claim 2, wherein the thickness of the layer of silicon/germanium alloy is around 200 Å.

4. The method according to claim 3, wherein the silicon/germanium alloy has a germanium content between 5 and 50%.

5. The method according to claim 4, wherein the silicon/germanium alloy has a germanium content of around 30%.

6. A method of protecting a semiconductor material against the formation of a metal silicide, wherein the semiconductor material belongs to a component of an integrated circuit, wherein the integrated circuit includes other components that have to be subjected to a siliciding operation, comprising:
   forming a layer of a silicon/germanium alloy on the semiconductor material; and
   wherein forming comprises:
      depositing the layer of silicon/germanium alloy on an entire integrated circuit; and
      removing the layer of silicon/germanium alloy from areas of the integrated circuit that are to be silicided.

7. The method according to claim 1, wherein the semiconductor material to be protected belongs to a polysilicon line.

8. The method according to claim 1, wherein the semiconductor material to be protected belongs to at least one of a source, drain and gate regions of a transistor.

9. A method of protecting a semiconductor material against the formation of a metal silicide, comprising:
   forming a layer of a silicon/germanium alloy on the semiconductor material;
   depositing a metal on an integrated circuit;
   forming a metal silicide on areas of the integrated circuit that are not protected by the silicon/germanium alloy;
   removing unreacted metal and a metal/silicon/germanium ternary alloy that may have formed when the metal silicide is formed; and
   removing the layer of silicon/germanium alloy so as to expose unsilicided areas of the integrated circuit.

10. A method for fabricating an integrated circuit, comprising:
    depositing a layer of a silicon/germanium alloy on an integrated circuit;
    removing the layer of silicon/germanium alloy from areas of the integrated circuit that are to be silicided;
    depositing a metal on an integrated circuit;
    forming a metal silicide on areas of the integrated circuit that are not protected by the silicon/germanium alloy;
    removing unreacted deposited metal and a metal/silicon/germanium ternary alloy that may have formed when the metal silicide is formed; and
    removing the layer of silicon/germanium alloy so as to expose unsilicided areas of the integrated circuit.

11. The method according to claim 10, wherein the thickness of the layer of silicon/germanium alloy is greater than about 50 Å.

12. The method according to claim 11, wherein the thickness of the layer of silicon/germanium alloy is around 200 Å.

13. The method according to claim 12, wherein the silicon/germanium alloy has a germanium content between 5 and 50%.

14. The method according to claim 13, wherein the silicon/germanium alloy has a germanium content of around 30%.

15. The method according to claim 10, wherein areas of the semiconductor material that are protected comprise a polysilicon line.

16. The method according to claim 10, wherein areas of the semiconductor material that are protected comprise one of a source, drain and gate regions of a transistor.

17. A method for fabricating an integrated circuit which includes first components to be subjected to a siliciding operation and second components not to be subjected to the siliciding operation, comprising:
depositing a layer of silicon/germanium alloy on the integrated circuit covering both the first and second components;
removing the layer of silicon/germanium alloy from the first components; and
siliciding the integrated circuit.

18. The method of claim 17 wherein siliciding comprises:
depositing a metal on the integrated circuit; and
forming a metal silicide on the first components that are not protected by the silicon/germanium alloy layer.

19. The method of claim 18 further comprising:
removing unreacted deposited metal and a metal/silicon/germanium ternary alloy that may have formed when the metal silicide is formed; and
removing the layer of silicon/germanium alloy so as to expose the second components.

20. The method of claim 17 wherein the first and second components comprise polysilicon areas of the integrated circuit.

21. The method of claim 17 wherein the first and second components comprise one of a gate, drain and source region of a transistor formed on the integrated circuit.

* * * * *